US012765073B2

(12) United States Patent
Sasaki et al.

(10) Patent No.: US 12,765,073 B2
(45) Date of Patent: Oct. 13, 2026

(54) SEMICONDUCTOR DEVICE

(71) Applicant: Kioxia Corporation, Tokyo (JP)

(72) Inventors: Syunsuke Sasaki, Kamakura (JP); Shouichi Ozaki, Tokyo (JP); Kenichi Sugawara, Yokohama (JP); Hiroaki Nakasa, Yokohama (JP); Takeshi Miyaba, Yokohama (JP); Maya Ohsaka, Yokohama (JP); Shoki Ito, Yokohama (JP)

(73) Assignee: Kioxia Corporation, Tokyo (JP)

( * ) Notice: Subject to any disclaimer, the term of this patent is extended or adjusted under 35 U.S.C. 154(b) by 295 days.

(21) Appl. No.: 18/590,804

(22) Filed: Feb. 28, 2024

(65) Prior Publication Data

US 2024/0321865 A1 Sep. 26, 2024

(30) Foreign Application Priority Data

Mar. 23, 2023 (JP) ................................ 2023-046953

(51) Int. Cl.

| | |
|---|---|
| ***H10D 89/60*** | (2025.01) |
| ***H10B 43/35*** | (2023.01) |
| ***H10B 43/40*** | (2023.01) |
| ***H10D 62/10*** | (2025.01) |
| ***H10D 84/85*** | (2025.01) |

(52) U.S. Cl.

CPC .......... *H10D 89/811* (2025.01); *H10B 43/35* (2023.02); *H10B 43/40* (2023.02); *H10D 62/106* (2025.01); *H10D 84/857* (2025.01); *H10D 89/921* (2025.01)

(58) Field of Classification Search

CPC .. H10D 89/811; H10D 62/106; H10D 84/857; H10D 89/921; H10B 43/35; H10B 43/40

See application file for complete search history.

(56) References Cited

U.S. PATENT DOCUMENTS

| | | | | |
|---|---|---|---|---|
| 10,121,778 | B2 | 11/2018 | Wakui et al. | |
| 2008/0135940 | A1 | 6/2008 | Hashigami | |
| 2008/0198519 | A1 | 8/2008 | Lim | |
| 2013/0161749 | A1 * | 6/2013 | Kim ..................... | H10D 89/811 257/E23.079 |

* cited by examiner

*Primary Examiner* — Herve-Louis Y Assouman

(74) *Attorney, Agent, or Firm* — Kim & Stewart LLP

(57) ABSTRACT

A semiconductor device includes a first pad to which a high voltage is to be input, a second pad to which a low voltage is to be input, a third pad to which a ground voltage is to be input, and a protection circuit provided between the first pad and the third pad. The protection circuit includes a first protection element group including a plurality of first transistors arranged in a first direction, a second protection element group including a plurality of second transistors arranged in the first direction and disposed apart from the first protection element group in a second direction orthogonal to the first direction, a guard ring provided around the first and second protection element groups, and an intermediate guard ring provided between the first protection element group and the second protection element group and connected to the third pad via a resistance element.

20 Claims, 14 Drawing Sheets

SEMICONDUCTOR DEVICE

CROSS-REFERENCE TO RELATED APPLICATION(S)

This application is based upon and claims the benefit of priority from Japanese Patent Application No. 2023-046953, filed Mar. 23, 2023, the entire contents of which are incorporated herein by reference.

FIELD

Embodiments described herein relate generally to a semiconductor device.

BACKGROUND

In recent years, in semiconductor devices, GG (Gate-Ground) NMOS has been adopted as an electro-static discharge (ESD) protection element. However, when ESD characteristics are attempted to be improved by GGNMOS, there is a problem in that latch-up is likely to occur in the semiconductor device.

DETAILED DESCRIPTION

Embodiments provide a semiconductor device capable of improving ESD characteristics while preventing the occurrence of latch-up.

In general, according to one embodiment, a semiconductor device includes a first pad to which a high voltage is to be input; a second pad to which a low voltage is to be input; a third pad to which a ground voltage is to be input; and a protection circuit provided between the first pad and the third pad, wherein the protection circuit includes a first protection element group including a plurality of first transistors arranged in a first direction, a second protection element group including a plurality of second transistors arranged in the first direction and disposed apart from the first protection element group in a second direction orthogonal to the first direction, a guard ring provided around the first and second protection element groups, and an intermediate guard ring provided between the first protection element group and the second protection element group and connected to the third pad via a resistance element.

Hereinafter, embodiments of the present disclosure will be described in detail with reference to the drawings.

First Embodiment

Figure 1:
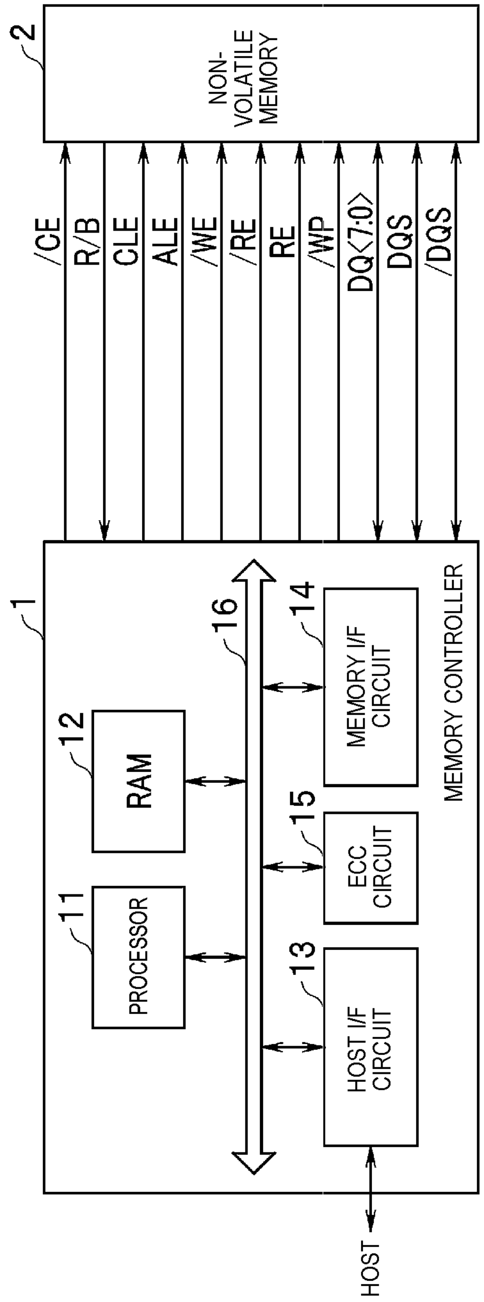
FIG. 1 is a block diagram showing a memory system including a semiconductor storage device as an example of a semiconductor device according to an embodiment of the present disclosure.

FIG. 1 is a block diagram showing a memory system including a semiconductor storage device as an example of a semiconductor device according to an embodiment of the present disclosure. The present embodiment makes it possible to improve ESD characteristics while preventing the occurrence of latch-up by optimizing the wiring resistance of a wiring for connecting a guard ring formed in the vicinity of the GGNMOS that operates as an ESD protection element and the power supply.

The present embodiment will be described by taking, for example, a NAND-type semiconductor storage device as an example of the semiconductor device, but the present embodiment may be applied to various semiconductor devices adopting GGNMOS as an ESD protection element.

Configuration of Memory System

FIG. 1 is a block diagram showing a configuration example of a memory system.

The memory system of the present embodiment includes a memory controller 1 and a non-volatile memory 2. The non-volatile memory 2 may include a plurality of memory chips. The memory system may be connected to a host device (not shown). The host device is, for example, an electronic device such as a personal computer or a mobile terminal.

The memory system may be implemented with a plurality of chips on a motherboard on which a host device is mounted, or may be configured as a large-scale integrated circuit (LSI) or a system-on-a-chip (SoC) in which the memory system is implemented as one module. Examples of the memory system include a memory card such as an SD card, a solid-state-drive (SSD), and an embedded-multi-media-card (eMMC).

The non-volatile memory 2 is a NAND-type memory including a plurality of memory cells, and stores data in a non-volatile manner. A specific configuration of the non-volatile memory 2 will be described later.

The memory controller 1 gives an instruction to the non-volatile memory 2 to write (also referred to as program), read, erase, and the like in response to, for example, an instruction from a host device. In addition, the memory controller 1 manages a memory space of the non-volatile memory 2. The memory controller 1 includes a processor 11, a random access memory (RAM) 12, a host interface (host I/F) circuit 13, a memory interface (memory I/F) circuit 14, an error checking and correcting (ECC) circuit 15, and the like.

The host I/F circuit 13 is connected to the host device via a host bus and performs an interface process between the host device and the host I/F circuit 13. The host I/F circuit 13 communicates with the host device to transmit and receive an instruction, an address, and data to and from the host device.

The processor 11 is configured with, for example, a central processing unit (CPU). The processor 11 controls an operation of the memory controller 1. For example, when the write instruction is received from the host device, the processor 11 issues the write instruction to the non-volatile memory 2 in response to the write instruction from the host device via the memory I/F circuit 14. The same applies to the case of reading and erasing. The processor 11 also executes various processes for managing the non-volatile memory 2, such as wear leveling.

The RAM 12 is used as a work region of the processor 11, and stores firmware data loaded from the non-volatile memory 2, various tables created by the processor 11, and the like. The RAM 12 is configured with, for example, a DRAM or an SRAM.

The memory I/F circuit 14 is connected to the non-volatile memory 2 via a bus and performs an interface process with the non-volatile memory 2. The memory I/F circuit 14 communicates the instruction, the address, and the data to and from the non-volatile memory 2.

The ECC circuit 15 generates an error correction code for write data at the time of writing the data, and adds the error correction code to the write data to transmit the error correction code to the memory I/F circuit 14. In addition, the ECC circuit 15 performs error detection and/or error correction on the read data by using the error correction code provided in the read data at the time of reading the data. The ECC circuit 15 may be provided in the memory I/F circuit 14.

Configuration of Non-Volatile Memory

Figure 2:
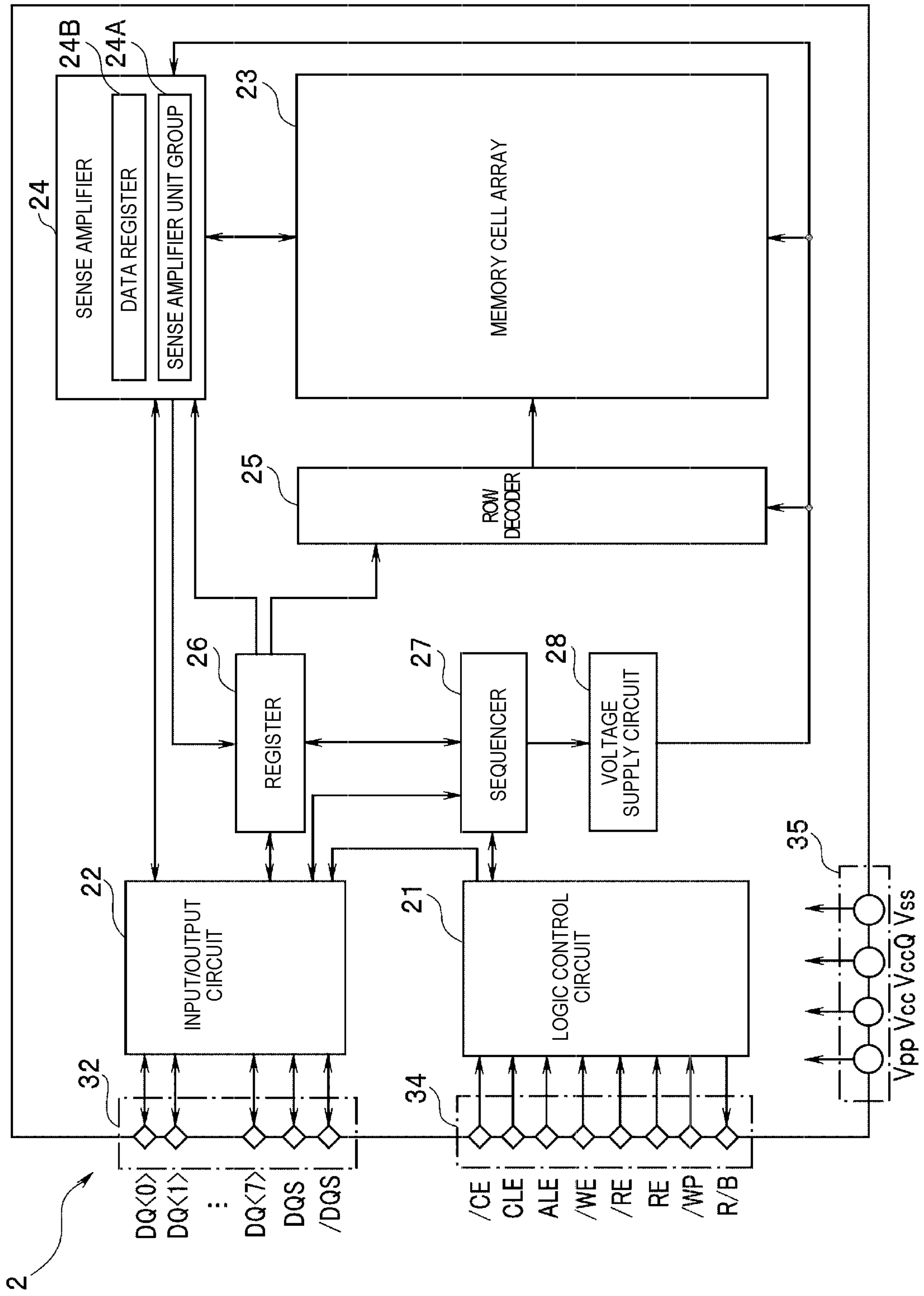
FIG. 2 is a block diagram showing an example of the non-volatile memory in FIG. 1.

FIG. 2 is a block diagram showing an example of the non-volatile memory 2 in FIG. 1. The non-volatile memory 2 includes a logic control circuit 21, an input/output circuit 22, a memory cell array 23, a sense amplifier 24, a row decoder 25, a register 26, a sequencer 27, a voltage supply circuit 28, an input/output pad group 32, a logic control pad group 34, and a power supply input pad group 35.

The memory cell array 23 includes a plurality of blocks. Each of the plurality of blocks BLK includes a plurality of memory cell transistors (memory cells). In order to control a voltage applied to the memory cell transistors, memory cell array 23 is provided with a plurality of bit lines, a plurality of word lines, a source line, and the like. The specific configuration of the block BLK will be described later.

The input/output pad group 32 includes a plurality of terminals (pads) corresponding to signals DQ<7:0> and corresponding to data strobe signals DQS and /DQS in order to transmit and receive each signal including data to and from the memory controller 1.

The logic control pad group 34 includes a plurality of terminals (pads) corresponding to a chip enable signal /CE, a command latch enable signal CLE, an address latch enable signal ALE, a write enable signal /WE, read enable signals RE and /RE, a write protect signal /WP, and a signal R/B in order to transmit and receive each signal to and from the memory controller 1.

The signal /CE enables the non-volatile memory 2 to be selected. The signal CLE enables commands transmitted as a signal DQ to be latched into a command register. The signal ALE enables addresses transmitted as a signal DQ to be latched into an address register. The signal WE enables writing. The signals RE enables reading. The signal WP inhibits writing and erasing. The signal R/B indicates whether the non-volatile memory 2 is in a ready state (a state in which it is possible to receive instructions from the outside) or a busy state (a state in which it is not possible to receive instructions from the outside). The memory controller 1 may know the state of the non-volatile memory 2 by receiving the signal R/B.

A signal prefixed with a symbol "/" indicates active low or negative logic. That is, a signal not prefixed with a symbol "/" becomes active at "H" level, while a signal prefixed with a symbol "/" becomes active at "L" level.

The power supply input pad group 35 includes a plurality of pads for inputting power supply voltages VCC, VCCQ, and VPP and a ground voltage VSS in order to supply various operating power supply voltages to the non-volatile memory 2 from the outside. The power supply voltage VCC is a circuit power supply voltage generally applied from the outside as an operating power supply, and receives a voltage of substantially 3.3 V, for example. For example, a voltage of 1.2 V is input as the power supply voltage VCCQ. The power supply voltage VCCQ is used when signals are exchanged between the memory controller 1 and the non-volatile memory 2.

The power supply voltage VPP is a power supply voltage higher than the power supply voltage VCC, and receives, for example, a voltage of 12 V. A high voltage of substantially 20 V is required when writing data to or erasing data from the memory cell array 23. At this time, a desired voltage may be generated at high speed and with low power consumption when the power supply voltage VPP of substantially 12 V is boosted by a booster circuit of the voltage supply circuit 28, rather than the power supply voltage VCC of substantially 3.3 V is boosted. The power supply voltage VCC is a power supply that is normally supplied to the non-volatile memory 2, and the power supply voltage VPP is a power supply that is additionally or optionally supplied according to the use environment, for example.

Incidentally, a very low voltage (VLV) transistor for a high-speed interface is used in a semiconductor device such as a semiconductor storage device. The VLV transistor is smaller in the gate oxide film thickness, the gate length, and the like than the low voltage (LV) transistor, and is significantly different in electrical characteristics. Therefore, as the ESD protection element provided in a path to which the VLV transistor is connected, a circuit configured with a diode and an RC trigger metal oxide semiconductor (RCTMOS) having a certain large-scale may be used so that a larger discharge current may be passed therethrough.

Meanwhile, for a path to which a relatively high voltage such as a power supply voltage VPP is input, GGNMOS configured with a high voltage (HV) transistor is employed because the voltage exceeds a breakdown voltage of the RCTMOS. As will be described later, the ESD protection element group including GGNMOS is provided between a VPP pad to which a power supply voltage VPP is supplied and a VSS pad to which a ground voltage VSS is supplied.

The logic control circuit 21 and the input/output circuit 22 are connected to the memory controller 1 via a NAND bus. The input/output circuit 22 communicates signals DQ (for example, DQ0 to DQ7) to and from the memory controller 1 via the NAND bus.

The logic control circuit 21 receives an external control signal (for example, a chip enable signal /CE, a command latch enable signal CLE, an address latch enable signal ALE, a write enable signal /WE, read enable signals RE and /RE, and a write protect signal /WP) from the memory controller 1 via the NAND bus. Also, the logic control circuit 21 transmits a ready/busy signal R/B to the memory controller 1 via the NAND bus.

The input/output circuit 22 exchanges the signals DQ<7:0> and the data strobe signals DQS and /DQS with the memory controller 1. The input/output circuit 22 transfers commands and addresses in the signals DQ<7:0> to the register 26. Further, the input/output circuit 22 exchanges write data and read data with the sense amplifier 24.

The register 26 includes a command register, an address register, a status register, and the like. The command register temporarily stores commands. The address register temporarily stores addresses. The status register temporarily stores status data relating to the operation of the non-volatile memory 2. The register 26 is configured with, for example, an SRAM.

The sequencer 27 receives a command from the register 26 and controls the non-volatile memory 2 in accordance with a sequence based on this command.

The voltage supply circuit 28 is controlled by the sequencer 27, receives a power supply voltage from outside the non-volatile memory 2, and generates a plurality of voltages required for a write operation, a read operation, and an erasing operation by using the power supply voltage.

The row decoder 25 receives a row address from the register 26 and decodes the row address. The row decoder 25 performs a selection operation of a word line based on the decoded row address. The row decoder 25 transfers a plurality of voltages required for the write operation, the read operation, and the erasing operation to the selected block.

The sense amplifier 24 receives a column address from the register 26 and decodes the column address. The sense amplifier 24 includes a sense amplifier unit group 24A and a data register 24B. The sense amplifier unit group 24A is connected to each bit line and selects any of the bit lines based on the decoded column address. Further, the sense amplifier unit group 24A detects and amplifies the data read from the memory cell transistor to the bit line at the time of reading the data. Further, the sense amplifier unit group 24A transfers written data to the bit line at the time of writing the data.

The data register 24B temporarily stores the data detected by the sense amplifier unit group 24A at the time of reading the data, and transfers the data to the input/output circuit 22 in a serial manner. In addition, the data register 24B temporarily stores the data transferred from the input/output circuit 22 in the serial manner at the time of writing the data, and transfers the data to the sense amplifier unit group 24A. The data register 24B is configured with the SRAM or the like.

Block Configuration of Memory Cell Array

Figure 3:
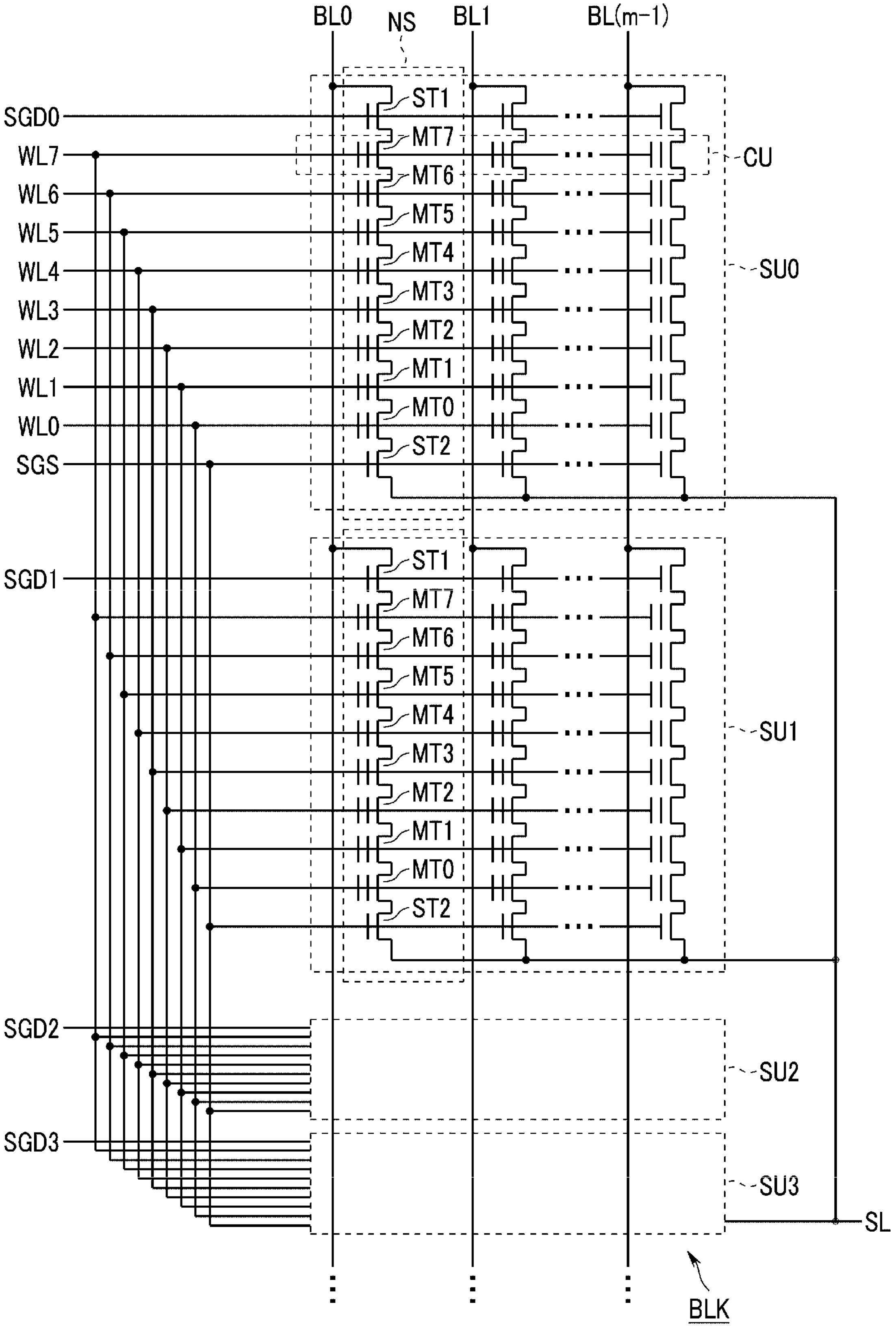
FIG. 3 is a diagram showing a configuration example of a block of a memory cell array having a three-dimensional structure.

FIG. 3 is a diagram showing a configuration example of a block of the three-dimensional structure memory cell array 23. FIG. 3 shows one block BLK of a plurality of blocks that make up the memory cell array 23. The other blocks of the memory cell array 23 also have the same configuration as in FIG. 3.

As shown, the block BLK includes, for example, four string units SU0 to SU3 (hereinafter, these are collectively referred to as the string unit SU). In addition, each of the string units SU has a NAND string NS including a plurality of memory cell transistors MT (MT0 to MT7) and select gate transistors ST1 and ST2. The number of memory cell transistors MT provided in the NAND string NS is set to 8 in FIG. 3, but may be further increased. The select gate transistors ST1 and ST2 are shown as a transistor in the electrical circuit, but may have the same structure as the memory cell transistor. In addition, a plurality of select gate transistors may be used as the select gate transistors ST1 and ST2, respectively. Furthermore, dummy cell transistors may be provided between the memory cell transistors MT and the select gate transistors ST1 and ST2.

The memory cell transistors MT are connected in series between the select gate transistors ST1 and ST2. The memory cell transistor MT7 on one end side (bit line side) is connected to the select gate transistor ST1, and the memory cell transistor MT0 on the other end side (source line side) is connected to the select gate transistor ST2.

The gate of select gate transistor ST1 of each of the string units SU0 to SU3 is connected to a corresponding one of the select gate lines SGD0 to SGD3 (hereinafter, collectively referred to as the select gate line SGD). In addition, the gate of the select gate transistor ST2 of each of the string units SU0 to SU3 is connected to the common select gate line SGS. The gates of the plurality of select gate transistors ST2 in each block BLK may be connected to the select gate lines SGS0 to SGS3 (not shown) (hereinafter, these are collectively referred to as the select gate line SGS), respectively.

The gates of the memory cell transistors MT0 to MT7 in the same block BLK are commonly connected to word lines WL0 to WL7, respectively. That is, the word lines WL0 to WL7 are commonly connected between the plurality of string units SU0 to SU3 in the same block BLK, whereas the select gate lines SGD are independent from each other for the string units SU0 to SU3 even in the same block BLK. The gates of the memory cell transistors MTi (i is 0 to 7 in FIG. 3) in the same row in the block BLK are connected to the same word line WLi.

Each NAND string NS is connected to a corresponding bit line. Therefore, each memory cell transistor MT is connected to the bit line via the select gate transistors ST1 and ST2 provided in the NAND string NS and other memory cell transistors MT. In general, data of the memory cell transistors MT in the same block BLK is collectively erased. Meanwhile, typically, reading and writing the data are collectively performed on a plurality of memory cell transistors MT commonly connected to one word line WL disposed in one string unit SU. Such a set of memory cell transistors MT sharing the word line WL in one string unit SU is referred to as a cell unit CU.

The write operation and the read operation for the cell unit CU are performed in units of pages. For example, when each cell is a triple level cell (TLC) capable of storing 3 bits (8 values) of data, one cell unit CU may store data of 3 pages. The 3 bits that may be stored by each memory cell transistor MT correspond to the 3 pages, respectively.

Cross-Section Structure of Non-Volatile Memory

Figure 4:
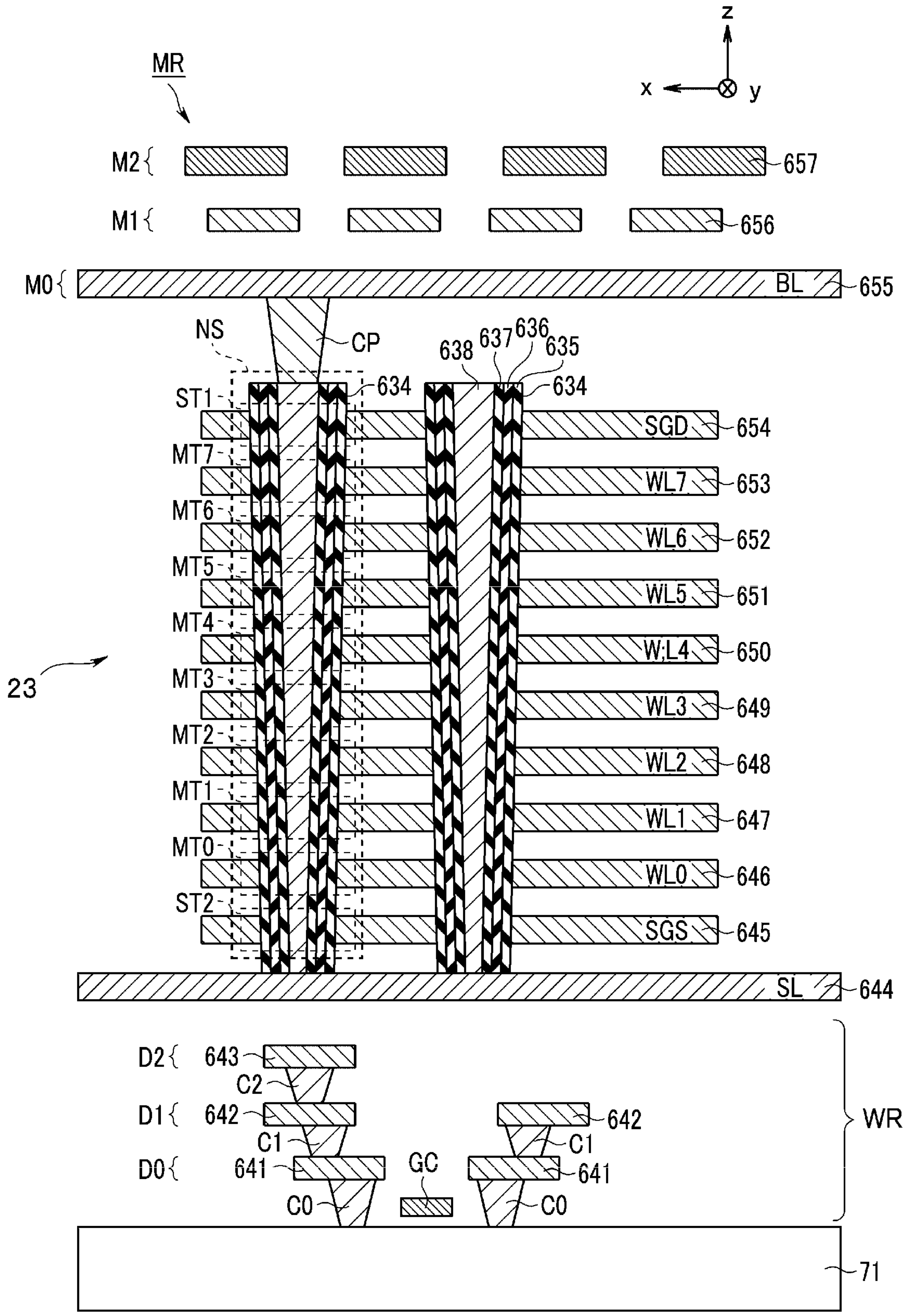
FIG. 4 is a cross-sectional view of a partial region of the semiconductor storage device according to the embodiment.

FIG. 4 is a cross-sectional view of a partial region of the semiconductor storage device according to the embodiment. FIG. 4 shows an example in which a peripheral circuit region corresponding to a peripheral circuit such as the sense amplifier 24 or the row decoder 25 is provided on the semiconductor substrate 71, and a memory region is provided on an upper layer of the peripheral circuit region. In the following description, two directions orthogonal to each other and parallel to the surface of the semiconductor substrate 71 are referred to as an x direction and a y direction, and a direction perpendicular to the surface of the semiconductor substrate 71 is referred to as a z direction.

As shown in FIG. 4, the non-volatile memory in the memory region MR includes the semiconductor substrate 71, the conductors 641 to 657, a memory pillar 634, and the contacts C0, Cl, and C2 and the contact plug CP. In the drawings described below, the P-type or N-type well region formed in the upper surface portion of the semiconductor substrate 71, the impurity diffusion region formed in each well region, and the gate insulating film and the element separation region that insulate the well regions from each other are not shown.

In the memory region MR, a conductor GC is provided on the semiconductor substrate 71 via the gate insulating film (not shown). In addition, for example, a plurality of contacts C0 are provided in each of a plurality of impurity diffusion regions (not shown) to sandwich the conductor GC in the semiconductor substrate 71. The memory cell array 23 is disposed on the semiconductor substrate 71 via a wiring layer region WR.

A conductor 641 forming a wiring pattern is provided on each of the contacts C0. For example, the conductor GC functions as a gate electrode of the transistor, and the conductor 641 functions as a source electrode or a drain electrode of the transistor.

For example, the contact C1 is provided on each conductor 641. For example, the conductor 642 is provided on each contact C1. For example, the contact C2 is provided on the conductor 642. For example, the conductor 643 is provided on the contact C2.

Each wiring pattern of the conductors 641, 642, and 643 is disposed in the wiring layer region WR. Hereinafter, the wiring layers in which the conductors 641, 642, and 643 are provided are referred to as wiring layers D0, D1, and D2, respectively. The wiring layers D0, D1, and D2 are provided in the lower layer portion of the non-volatile memory 2. Here, the three wiring layers D0 to D2 are provided in the wiring layer region WR, but two or less wiring layers or four or more wiring layers may be provided in the wiring layer region WR.

For example, the conductor 644 is provided above the conductor 643 with an interlayer insulating film interposed therebetween. The conductor 644 is formed in a plate shape parallel to an xy plane, and functions as a source line CELSRC. Above the conductor 644, for example, conductors 645 to 654 are stacked in order to correspond to each NAND string NS. The interlayer insulating film (not shown) is provided between the conductors adjacent to each other in the z direction among the conductors.

Each of the conductors 645 to 654 is formed in a plate shape parallel to the xy plane, for example. For example, the conductor 645 functions as a select gate line SGS, the conductors 646 to 653 function as word lines WL0 to WL7, respectively, and the conductor 654 functions as a select gate line SGD.

Each memory pillar 634 is in a columnar shape, penetrates each of the conductors 645 to 654, and is in contact with the conductor 644. The memory pillar 634 includes, for example, a semiconductor layer (and thus also referred to as a semiconductor pillar) 638 having a pillar shape on the center side, a tunnel insulating film 637 formed on the outside of the semiconductor layer 638, a charge accumulation film 636 formed on the outside of the tunnel insulating film 637, and a block insulating film 635 formed on the outside of the charge accumulation film 636.

For example, a portion where the memory pillar 634 and the conductor 645 intersect functions as the select transistor ST2. The portion where the memory pillar 634 and each of the conductors 646 to 653 intersect functions as a memory cell transistor (memory cell) MT. A portion where the memory pillar 634 and the conductor 654 intersect functions as the select transistor ST1.

A conductor 655 is provided on an upper layer with respect to the upper surface of the memory pillar 634 with an interlayer insulating film interposed therebetween. The conductor 655 is formed in a line shape extending in the x direction and corresponds to the bit line BL. The plurality of conductors 655 are arranged at intervals in the y direction (not shown). The conductor 655 is electrically connected to the semiconductor layer 638 in one memory pillar 634 corresponding to each string unit SU.

Specifically, in each string unit SU, for example, the contact plug CP is provided on the semiconductor layer 638 in each memory pillar 634, and one conductor 655 is provided on the contact plug CP. In addition, the semiconductor layer 638 and the conductor 655 in the memory pillar 634 are not limited to such a configuration, and may be connected to each other via a plurality of contacts, wirings, or the like.

The conductor 656 is provided on a layer above the layer on which the conductor 655 is provided, with the interlayer insulating film interposed therebetween. The conductor 657 is provided on a layer above the layer on which the conductor 656 is provided, with the interlayer insulating film interposed therebetween.

The conductors 656 and 657 correspond to, for example, the wiring provided in the memory cell array 23 and the wiring for connecting the peripheral circuit provided below the memory cell array 23. The conductors 656 and 657 may be connected to each other by a columnar contact (not shown). Here, the layer provided with the conductor 655 is referred to as a wiring layer M0, the layer provided with the conductor 656 is referred to as a wiring layer M1, and the layer provided with the conductor 657 is referred to as a wiring layer M2.

As shown in FIG. 4, in the semiconductor storage device of the embodiment, wiring layers D0, D1, and D2 are formed in the lower layer of the memory region MR. In addition, wiring layers M0, M1, and M2 are formed on the upper layer of the memory region MR. The wiring layers D0, D1, and D2 are tungsten wirings formed by, for example, a damascene method.

The wiring layer M2 is, for example, an aluminum wiring formed by anisotropic etching such as reactive ion etching (RIE). The wiring layer M2 has a large film thickness and low resistance, and thus is assigned to a main power supply wiring (VCC, VSS). The wiring layer M1 is, for example, a copper (Cu) wiring formed by a damascene method. Since the Cu wiring has high wiring reliability such as electromigration (EM) resistance, the wiring layer M1 is assigned a signal line that needs to reliably transfer data. The wiring layer M0 is, for example, a Cu wiring formed by the damascene method. A portion of the main power supply wiring is also assigned for the purpose of power supply reinforcement in addition to being used as the bit line BL. In addition, since it is preferable that the resistance of the wiring other than the main power supply wiring such as a signal line is as low as possible, the wiring is formed using the wiring layer in the upper layer (for example, the wiring layer M2) as much as possible.

Figure 5:
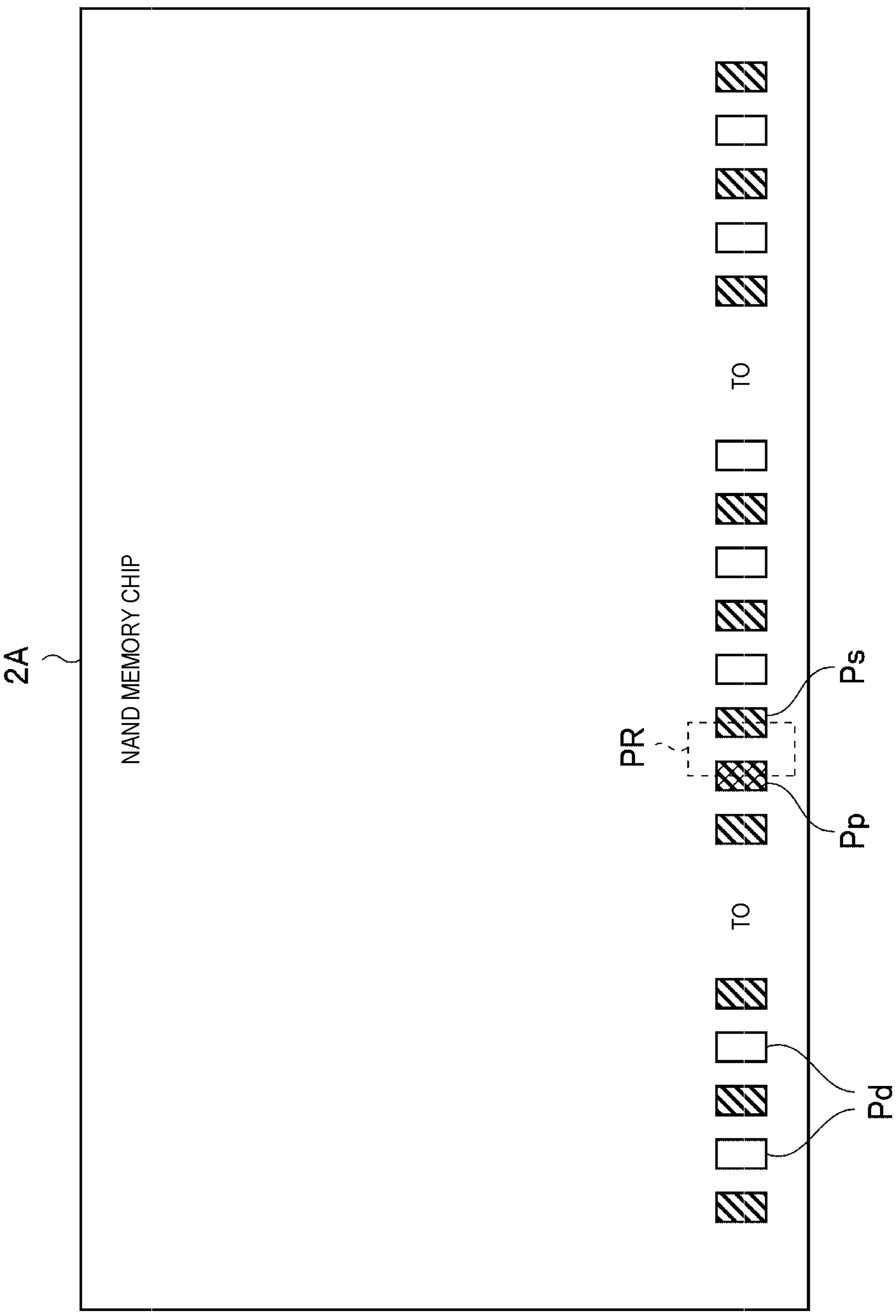
FIG. 5 is a diagram showing an example of the arrangement of pads on a semiconductor storage device on which the non-volatile memory is formed.

FIG. 5 is a diagram showing an example of the arrangement of pads on the NAND memory chip 2A on which the non-volatile memory 2 is formed. In addition, FIG. 6 is a plan view showing a comparative example of a protection element group by a plurality of GGNMOS formed in a region PR (dashed line portion) between the VPP pad and the VSS pad in FIG. 5.

As shown in FIG. 5, a plurality of pads shown by a square frame are disposed along an end side of the chip 2A. For example, the pad indicated by the oblique lines is a VSS pad Ps to which the ground voltage VSS is supplied. In addition, for example, the pad Pd is a pad to which the signal line DQ is connected. In addition, for example, the pad indicated by cross-hatching is a VPP pad Pp to which the voltage VPP is supplied. The ESD protection element group is formed in a region PR (dashed line frame) between the VPP pad Pp and the VSS pad Ps.

Configuration of Protection Element Group of Comparative Example

Figure 6:
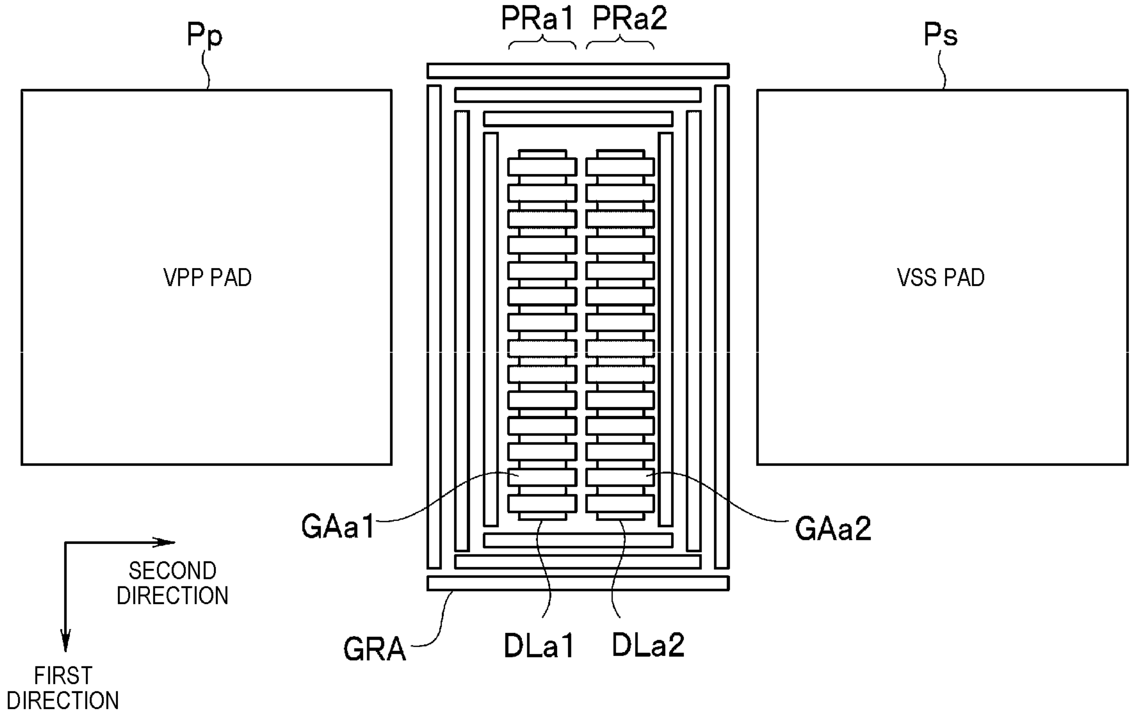
FIG. 6 is a plan view showing a comparative example of a protection element group by a plurality of GGNMOS formed in a region PR between the VPP pad and the VSS pad of FIG. 5.

FIG. 6 shows a comparative example of a protection element group formed between the VPP pad and the VSS pad. A plurality of GGNMOS sources and drains are formed by a plurality of diffusion layers DLa1 arranged in the first direction in FIG. 6. The plurality of GGNMOS arranged in the first direction are formed by the diffusion layer DLa1 and the plurality of gates GAa1 arranged between the diffusion layers DLa1. The first protection element group PRa1 is formed of the plurality of GGNMOS formed in the first direction.

The "source" and "drain" of the GGNMOS are relative to each other. For example, in an NMOS transistor (a transistor in which an electron serves as a carrier) having two diffusion layers and a gate, one of the two diffusion layers to which a low voltage is supplied functions as a source, as a supply source of the carrier, and one of the two diffusion layers to which a high voltage is supplied functions as a drain, as an outlet of the carrier. In other words, the two diffusion layers in the MOS transistor function as "one of the source or the drain" and "the other of the source or the drain", respectively. In the following description, for convenience, the side to which the lower voltage is supplied in a normal state may be referred to as a "source", and the side to which a higher voltage is supplied in a normal state may be referred to as a "drain". In this case, the "source" and the "drain" may not match the supply source and the outlet of the carrier.

A second protection element group PRa2 having the same configuration as the first protection element group PRa1 is formed to be separated in a second direction orthogonal to the first direction with respect to the first protection element group PRa1. That is, the second protection element group PRa2 includes a plurality of GGNMOS formed of a plurality of diffusion layers DLa2 arranged in the first direction and a plurality of gates GAa2 arranged between the diffusion layers DLa2.

In each GGNMOS forming the first and second protection element groups PRa1 and PRa2, the source and the gate are commonly connected to the VSS pad Ps, and the drain is connected to the VPP pad. In FIG. 6, these wirings are not shown. In addition, three layers of guard rings GRA are formed to surround the first and second protection element groups PR1 and PR2.

Figure 7:
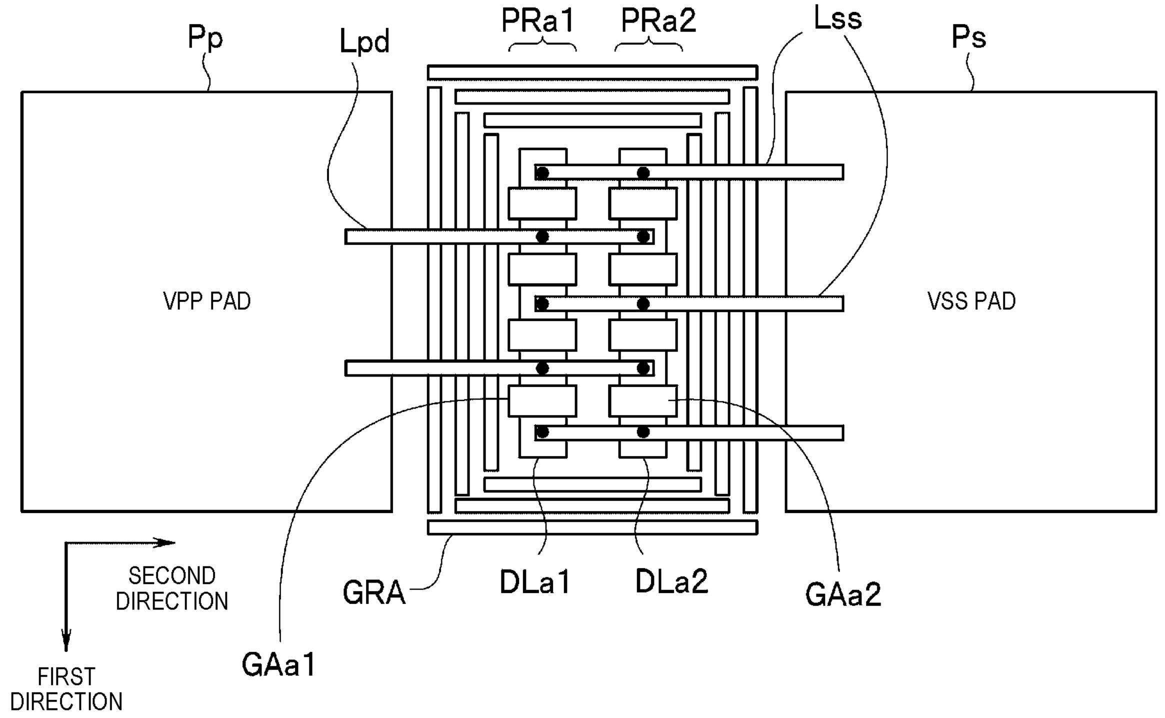
FIG. 7 is an explanatory view illustrating wirings between a VPP pad and a VSS pad and a source and a drain of GGNMOS.

FIG. 7 is an explanatory view illustrating wirings between a VPP pad and a VSS pad and a source and a drain of GGNMOS. In FIG. 7, the same elements as in FIG. 6 are denoted by the same reference numerals, and descriptions thereof will be omitted. Although FIG. 7 shows an example in which the number of GGNMOS forming the first and second protection element groups PRa1 and PRa2 is 4, respectively, the same wiring layout is used even when the number of GGNMOS is large.

As shown in FIG. 7, the power supply voltage VPP from the VPP pad Pp is transmitted by the wiring Lpd. The wiring Lpd is electrically connected to the diffusion layer DLa1 that functions as the drain of the GGNMOS of the first protection element group PRa1 and the diffusion layer DLa2 that functions as the drain of the GGNMOS of the second protection element group PRa2 by the contact indicated by the black circle. The diffusion layer DLa1 that functions as the source and the diffusion layer DLa2 that functions as the source are connected to the wiring Lss via the contacts indicated by the black circles, respectively. The wiring Lss is connected to the VSS pad Ps to supply the power supply voltage VSS to the gate and the source of the GGNMOS. As will be described later, the gate GAa1 and the gate GAa2 are connected to the VSS pad Ps via a drain-source path of a transistor (not shown) to which the ground voltage VSS is supplied to the gate and the source.

Structure of GGNMOS

Figure 8:
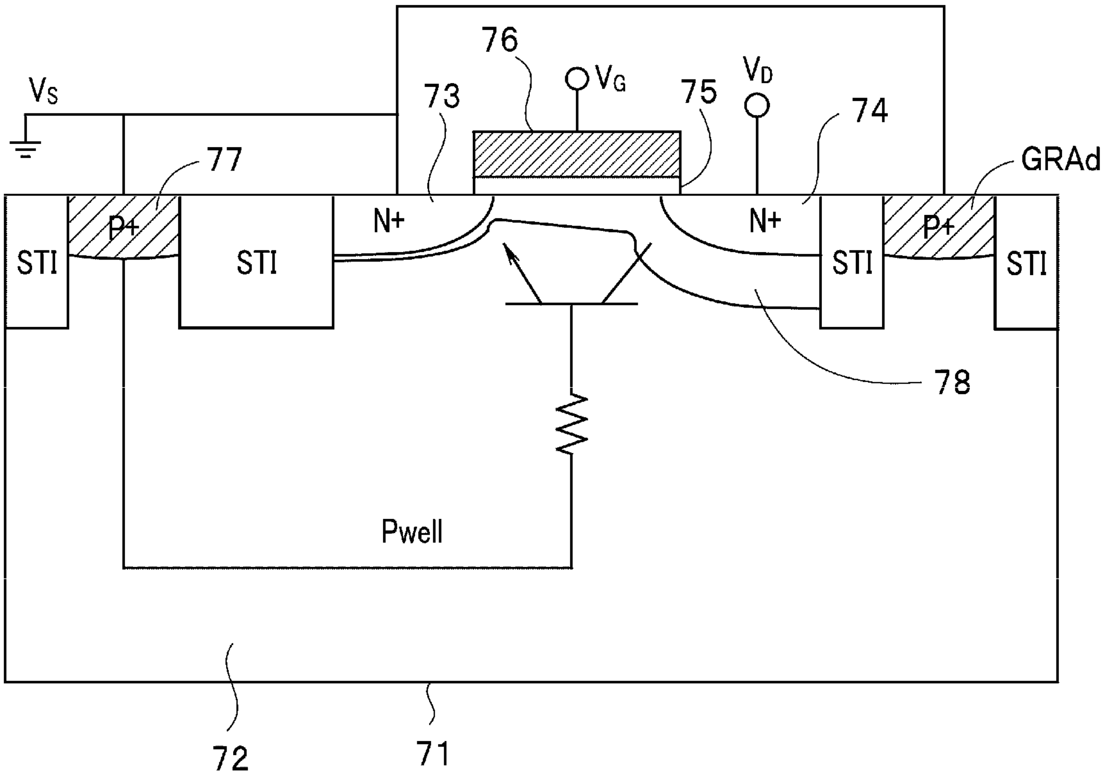
FIG. 8 is an explanatory diagram illustrating GGNMOS.
Figure 9:
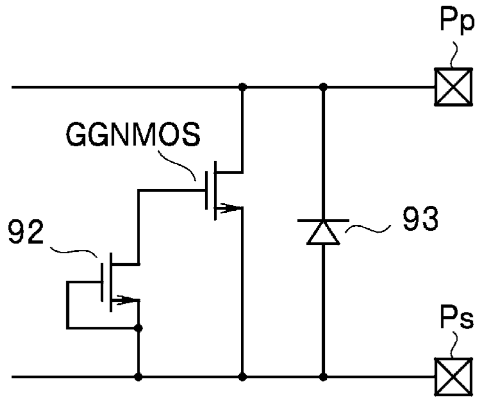
FIG. 9 is a circuit diagram showing a connection relationship between GGNMOS and VPP pad Pp and VSS pad Ps.

FIG. 8 is an explanatory diagram illustrating GGNMOS. FIG. 8 schematically shows cross sections of the GGNMOS and the adjacent guard ring GRA portion. In addition, FIG. 9 is a circuit diagram showing the connection relationship between the GGNMOS and the VPP pad Pp and the VSS pad Ps.

As shown in FIG. 8, a P-type well region 72 is formed in the upper surface portion of the semiconductor substrate 71 in the GGNMOS. An impurity diffusion region 73 that functions as the source and an impurity diffusion region 74 that functions as the drain are formed in the well region 72. A gate insulating film 75 is formed between the impurity diffusion regions 73 and 74 (DLa1 and DLa2 in FIG. 6), and a gate 76 (GAa1 and GAa2 in FIG. 6) is formed on the gate insulating film 75.

In addition, the contact region 77 is also formed in the well region 72. The impurity diffusion region 73, the contact region 77, and the gate 76 are connected to the VSS pad Ps, and the ground voltage VSS is supplied thereto. That is, the ground voltage VSS is supplied to the gate and source of the GGNMOS, and the GGNMOS is turned off. In addition, the impurity diffusion region 74 that functions as the drain is connected to the VPP pad Pp.

The element separation region STI is formed on the substrate surface side other than the formation region of the GGNMOS and the formation region of the contact region 77. For example, the element separation region STI is formed by shallow trench isolation (STI) in which an insulating layer such as a silicon oxide film or a silicon nitride film is embedded.

As shown in FIG. 9, in the GGNMOS, the drain is connected to the VPP pad Pp, and the source is connected to the VSS pad Ps. The gate of the GGNMOS is connected to the VSS pad Ps via the drain-source path of the NMOS transistor 92. A ground voltage VSS is applied to the gate and the source of the transistor 92. A PN junction diode 93 to be described later is formed between the VSS pad Ps and the VPP pad Pp.

When a high voltage VPP+ is applied to the VPP pad Pp in a state where the VSS pad Ps is grounded due to the occurrence of a surge or the like, the GGNMOS is turned on, and the surge current flows to the VSS pad Ps to protect the circuit. For example, it is assumed that the voltage of the drain of the GGNMOS connected to the VPP pad Pp increases. Then, the electric field of the depletion layer 78 on the drain side increases, electrons and holes are generated, and the holes move toward the 0 V substrate 71 (avalanche breakdown). The drain and the source of the GGNMOS are formed by an N-type diffusion layer, and a parasitic bipolar transistor shown in FIG. 8 is formed by the drain, the substrate, and the source of the GGNMOS based on the P-type well region 72. When the substrate is positively biased by the holes flowing to the substrate due to the avalanche breakdown, a snapback in which the parasitic bipolar transistor is turned on occurs, and the current flows from the drain to the source.

When a negative high voltage VPP− is applied to the VPP pad Pp in a state where the VSS pad Ps is grounded due to the occurrence of the surge or the like, a current flows via the PN junction diode 93 formed of the impurity diffusion region 74 that functions as the drain and the contact region GRAd that constitutes the adjacent guard ring GRA, and the circuit is protected.

Figure 10:
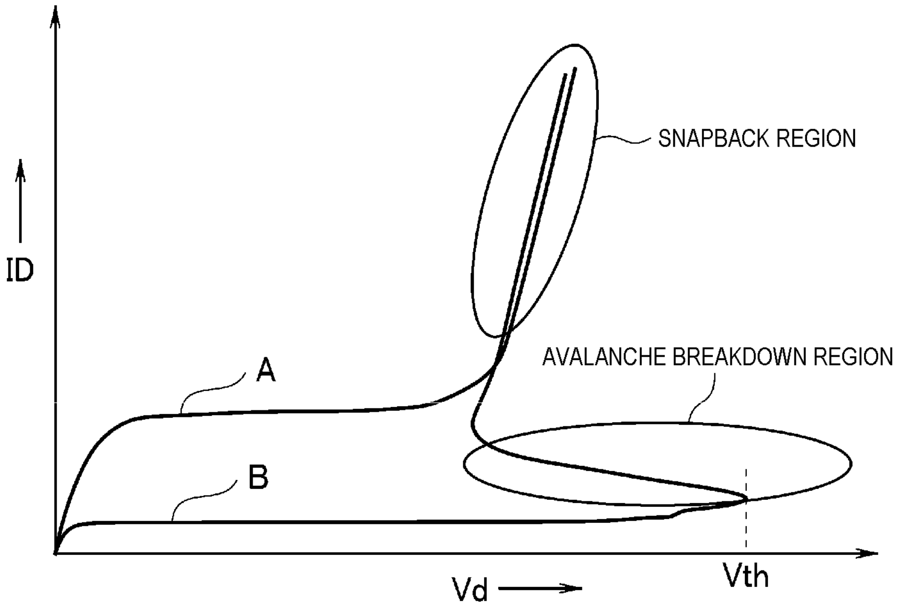
FIG. 10 is a graph showing the snapback characteristics of the GGNMOS, in which a drain voltage is represented by the horizontal axis and a drain current is represented by the vertical axis.

As shown in FIG. 7, when the wirings Lpd and Lss are disposed, as long as the VSS pad Ps is grounded and the high voltage VPP+ is generated in the VPP pad Pp, the voltage of the drain by the diffusion layers DLa1 and DLa2 increases via the wiring Lpd. As a result, a current flows from the wiring Lpd to the wiring Lss via the drain and the source by the diffusion layer DLa1 and the drain and the source by the diffusion layer DLa2, and the snapback current flows to the VSS pad Ps. In this manner, even when the surge occurs, the circuit can be protected. Characteristics of GGNMOS FIG. 10 is a graph showing the snapback characteristics of the GGNMOS, in which the drain voltage Vd is represented by the horizontal axis and the drain current is represented by the vertical axis.

The snapback is generated by the drain voltage Vd of the GGNMOS being higher than the avalanche breakdown voltage Vth. FIG. 10 shows characteristics when the VSS pad Ps is in a grounded state and the surge of a high voltage VPP+ is applied to the VPP pad Pp. A characteristic curve A in FIG. 10 shows a characteristic when the gate voltage Vg is high, and a characteristic curve B shows a characteristic when the gate voltage Vg is low.

The avalanche breakdown does not occur until the drain voltage Vd exceeds the avalanche breakdown voltage Vth. Therefore, it may be said that the GGNMOS having a lower avalanche breakdown voltage Vth has better ESD characteristics. A transistor 92 that is always turned off is connected between the gate of the GGNMOS and the VSS pad Ps. The characteristics of the GGNMOS change depending on the resistance between the source and the drain of the transistor 92. The higher the resistance between the source and the drain of the transistor 92, the closer the characteristic curve A, and the lower the resistance, the closer the characteristic curve B. When the resistance between the source and the drain of the transistor 92 is high, there is an advantage in that the avalanche breakdown voltage Vth is low. Meanwhile, when in a normal operation, the gate voltage Vg of the GGNMOS is high, and the leakage current is large.

In the GGNMOS, the breakdown current flowing through the VSS pad Ps by the snapback depends on the unit gate width of the GGNMOS. When the unit gate width of the GGNMOS is small, the breakdown current is small and the ESD characteristics are low. In order to improve the ESD characteristics, a method of increasing the unit gate width of the GGNMOS is considered. However, in this case, latch-up is likely to occur in the semiconductor device.

Latch-up is a phenomenon in which a large current flows in the PNPN junction in the semiconductor device. A parasitic thyristor is formed by the PNPN junction by GGNMOS and the other transistors. When the unit gate width of the GGNMOS is increased and the distance between the GGNMOS and the guard ring GRA that supplies the ground voltage VSS is increased, the voltage of the semiconductor substrate 71 is likely to be floating, and the voltage of the semiconductor substrate 71 is likely to increase. When the voltage of the semiconductor substrate 71 is increased, a current flows to the gate of the parasitic thyristor, and the parasitic thyristor is turned on. As a result, a large current continues to flow to the parasitic thyristor.

In order to prevent the occurrence of such latch-up, it is preferable to stabilize the voltage of the semiconductor substrate 71. Therefore, a method of forming a guard ring for supplying the ground voltage VSS between the first protection element group PRa1 and the second protection element group PRa2 (hereinafter, referred to as an intermediate guard ring) is adopted.

Figure 11:
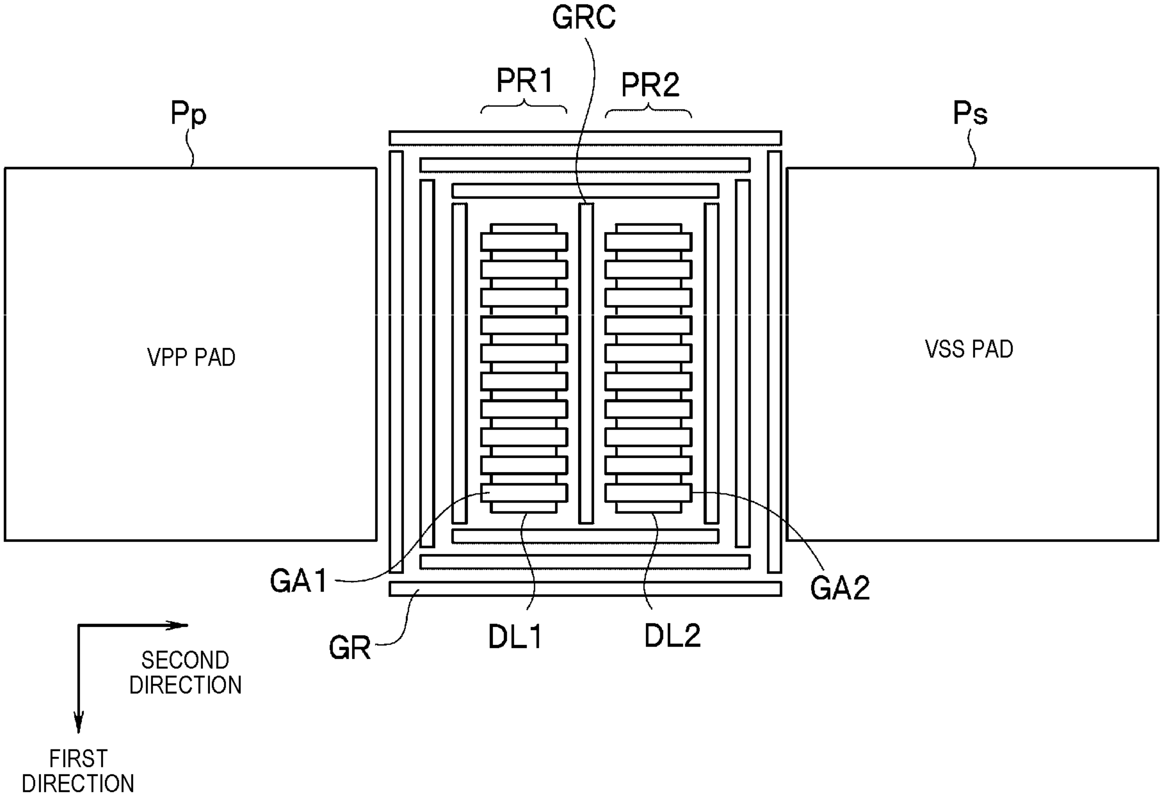
FIG. 11 is a plan view showing a configuration of a comparative example of an ESD protection element including an intermediate guard ring.

FIG. 11 is a plan view showing a configuration of a comparative example of an ESD protection element including the intermediate guard ring. In FIG. 11, the same elements as in FIG. 6 are denoted by the same reference numerals, and descriptions thereof will be omitted. In FIG. 11 as well, the wiring between the VPP pad and the VSS pad and the source and drain of the GGNMOS is not shown.

The first protection element group PR1 in FIG. 11 has the same structure as the first protection element group PRa1 except that the unit gate width thereof is longer than that of the first protection element group PRa1. That is, the unit gate widths of diffusion layer DL1 and the gate GA1 are longer than those of the diffusion layer DLa1 and the gate GAa1, respectively. Further, the second protection element group PR2 has the same structure as the second protection element group PRa2 except that the unit gate width thereof is longer than that of the second protection element group PRa2. That is, the unit gate widths of diffusion layer DL2 and the gate GA2 are longer than those of the diffusion layer DLa2 and the gate GAa2, respectively. In addition, three layers of guard rings GR surround the first and second protection element groups PR1 and PR2.

In the example of FIG. 11, an intermediate guard ring GRC extending in the first direction is formed at the center in the second direction between the first protection element group PR1 and the second protection element group PR2 to partition the first protection element group PR1 and the second protection element group PR2. The intermediate guard ring GRC is supplied with the ground voltage VSS from the VSS pad Ps. The ground voltage VSS is supplied to the vicinity of the GGNMOS by the intermediate guard ring GRC, and the voltage of the semiconductor substrate 71 is less likely to be floating, so that it is possible to make it difficult for the PNPN junction transistor, which causes latch-up, to be conductive.

However, in a case where the intermediate guard ring GRC is formed to be supplied with the ground voltage VSS, the voltage of the semiconductor substrate 71 is less likely to be floating. Therefore, the semiconductor substrate 71 is less likely to be positively biased, and the avalanche breakdown voltage Vt required for snapback increases. When the avalanche breakdown voltage Vth increases, as described above, the ESD characteristics deteriorate. That is, in the configuration in which the intermediate guard ring GRC for supplying the ground voltage VSS is provided, it is difficult to satisfy both the latch-up characteristics and the ESD characteristics at the same time.

Configuration of Protection Element Group

In the present embodiment, in order to adjust the voltage of the semiconductor substrate 71 so that it is more likely to be floating, the resistance of the wiring between the intermediate guard ring GRC and the VSS pad Ps that supplies the ground voltage VSS to the intermediate guard ring GRC is appropriately set as described above. That is, an optimum resistance value is selected at which the avalanche breakdown voltage Vt is lowered within a range in which latch-up does not occur. This makes it possible to provide a semiconductor device having characteristics that satisfy both latch-up characteristics and ESD characteristics.

Figure 12:
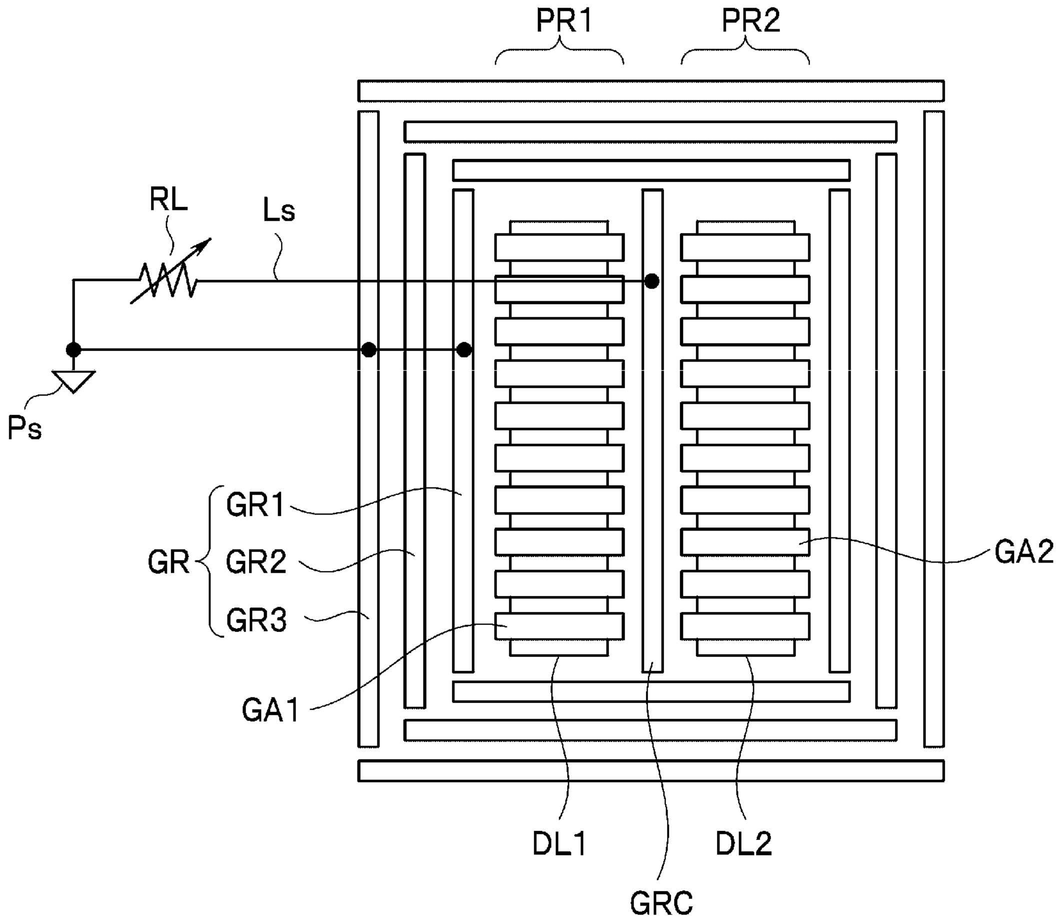
FIG. 12 is an explanatory view showing a configuration of a protection element group in the present embodiment.

FIG. 12 is an explanatory view showing a configuration of a protection element group in the present embodiment. In FIG. 12, the same elements as in FIG. 11 are denoted by the same reference numerals, and redundant descriptions will be omitted.

The configurations of the first protection element group PR1, the second protection element group PR2, the intermediate guard ring GRC, and the guard ring GR that make up the protection element group shown in FIG. 12 are the same as those in FIG. 11. The guard ring GR has a three-layer structure of a guard ring GR1 most adjacent to the first and second protection element groups PR1 and PR2, a guard ring GR2 that surrounds the guard ring GR1, and a guard ring GR3 that surrounds the guard ring GR2. The guard rings GR1 and GR3 are connected to the VSS pad Ps and are supplied with the ground voltage VSS. In addition, the intermediate guard ring GRC is connected to the VSS pad Ps via the wiring Ls. The guard ring GR2 is supplied with, for example, a power supply voltage VCC.

In the present embodiment, the resistance value of the wiring resistance RL of the wiring Ls is variable. The larger the resistance value RL, the better the ESD characteristics. On the contrary, the smaller the resistance value RL, the better the latch-up characteristics. In the present embodiment, the resistance value RL is adjusted to improve the ESD characteristics and the latch-up characteristics.

Figure 13:
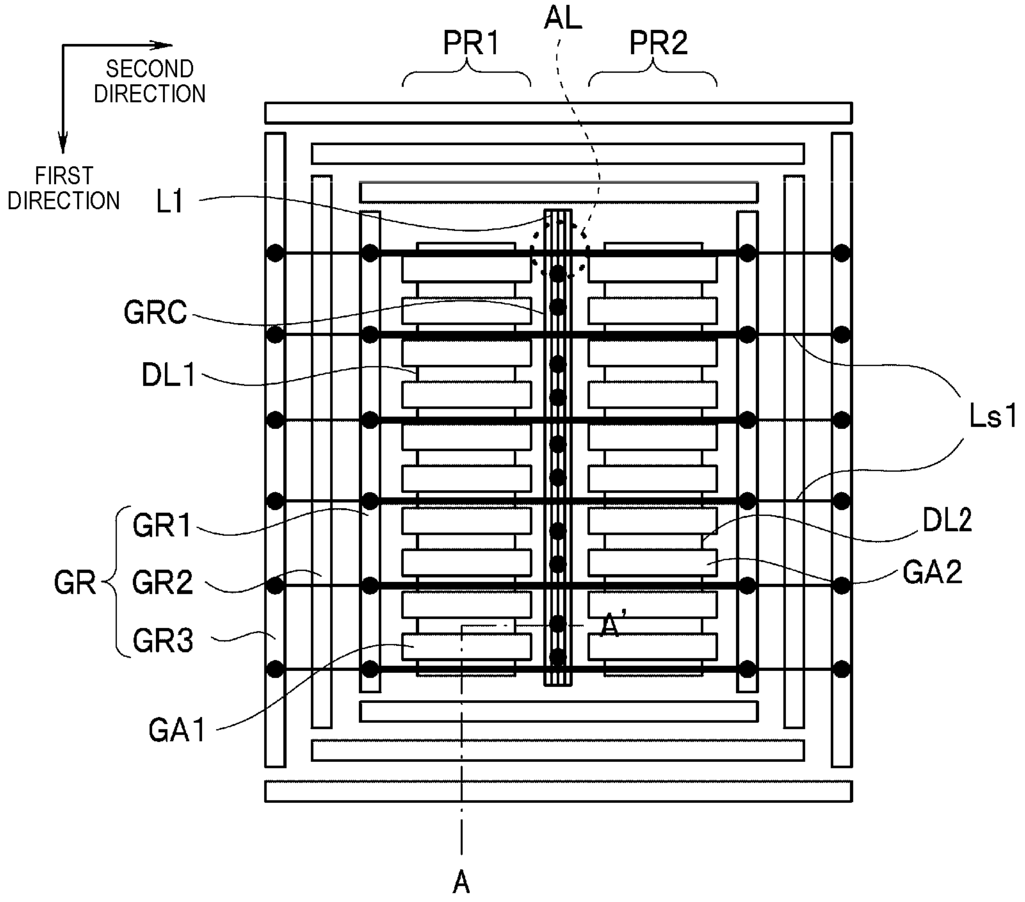
FIG. 13 is an explanatory view showing an example of a specific configuration of a wiring.

FIG. 13 is an explanatory view showing an example of a specific configuration of a wiring Ls. In FIG. 13, the same elements as in FIG. 11 are denoted by the same reference numerals, and descriptions thereof will be omitted. In FIG. 13 as well, the wiring between the VPP pad and the VSS pad and the source and drain of the GGNMOS is not shown. In addition, FIG. 14 is an enlarged plan view showing a region surrounded by a circle in FIG. 13.

As shown in FIG. 13, a plurality of wirings L1 along the extension direction (first direction) of the intermediate guard ring GRC are disposed in a predetermined wiring layer on the intermediate guard ring GRC. The plurality of black circles depicted on the wiring region of the wiring L1 represent contacts that electrically connect between each of wiring L1 and the intermediate guard ring GRC, respectively. That is, although not shown in FIG. 13, these contacts electrically and individually connect each of the wiring L1 and the intermediate guard ring GRC to each other, respectively.

In addition, a plurality of wirings Ls1 extending in a second direction orthogonal to the first direction are formed in the predetermined wiring layer. Each of the wirings Ls1 is electrically connected to the VSS pad Ps. The wiring Ls1 and the guard rings GR1 and GR3 are electrically connected to each other by contacts indicated by black circles. The wiring Ls1 supplies the ground voltage VSS to the guard rings GR1 and GR3. In the present embodiment, the plurality of wirings L1 and the wiring Ls1 are formed in the same wiring layer, for example.

Figure 14:
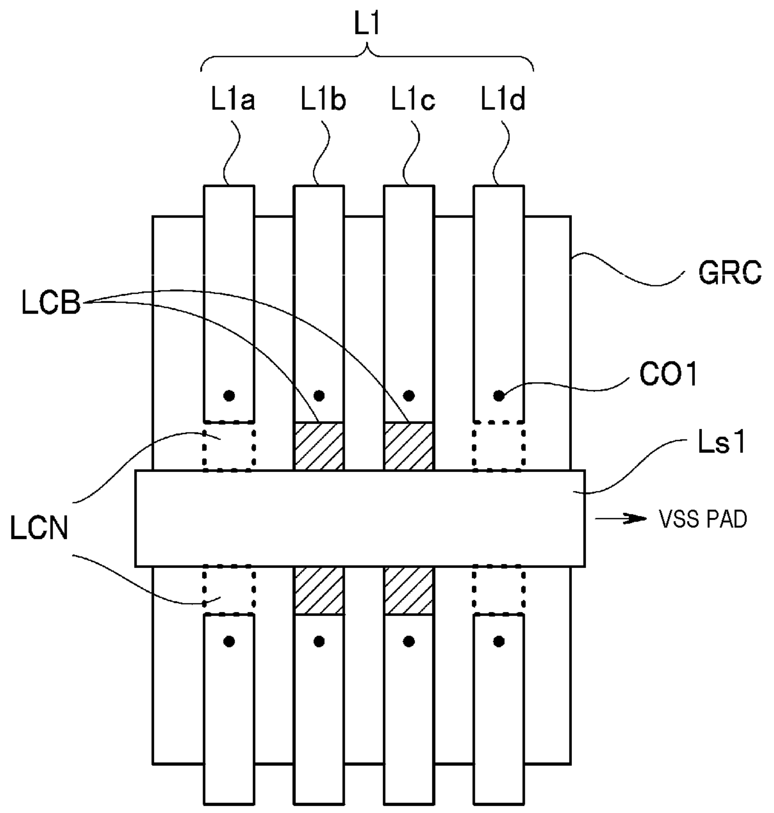
FIG. 14 is an enlarged plan view showing a region surrounded by a circle in FIG. 13.

FIG. 14 shows an example in which the wiring L1 is includes four wirings L1*a*, L1*b*, L1*c*, and L1*d*. In the present embodiment, as shown in FIG. 14, the wirings L1*a* to L1*d* may be formed in a divided state in a region (hereinafter, referred to as a resistance adjustment region) at each position intersecting the wiring Ls1 in the first direction. In addition, the resistance adjustment region may be formed in a state where the wirings L1*a* to L1*d* and the wiring Ls1 are connected. The respective wirings L1*a*, L1*b*, L1*c*, and L1*d* are configured to be electrically connectable to the intermediate guard ring GRC by the contact CO1 indicated by the black circle in each region to be divided.

In the example of FIG. 14, among the four wirings L1*a* to L1*d*, the wirings L1*a* and L1*d* have a wiring non-formed region LCN (dashed line frame) in which the wiring is not formed in the resistance adjustment region. That is, the wirings L1*a* and L1*d* are not in contact with the wiring Ls1 and are not electrically connected to the wiring Ls1. On the other hand, in the example of FIG. 14, the wiring L1*b* and L1*c* of the four wirings L1*a* to L1*d* have the wiring connection portion LCB (hatched portion) connected to the wiring Ls1 in the resistance adjustment region. That is, the wirings L1*b* and L1*c* are electrically connected to the wiring Ls1 by the wiring connection portion LCB.

That is, in the example of FIG. 14, the two wirings, which are half of the four wirings L1*a* to L1*d*, are connected to the wiring Ls1, and the wiring resistance between the VSS pad Ps and the intermediate guard ring GRC is large as compared with a case where all the four wirings L1*a* to L1*d* are connected to the wiring Ls1.

Among the plurality of wirings L1, the larger the number of wirings electrically connected to the wiring Ls1, the smaller the wiring resistance between the VSS pad Ps and the intermediate guard ring GRC. On the contrary, the smaller the number of wirings L1 electrically connected to the wiring Ls1, the larger the wiring resistance between the VSS pad Ps and the intermediate guard ring GRC. As described above, in the resistance adjustment region, the wiring resistance between the VSS pad Ps and the intermediate guard ring GRC may be appropriately set depending on the number of wiring connection portions LCB to be formed (the number of wiring non-formed regions LCN to be left).

Figure 15:
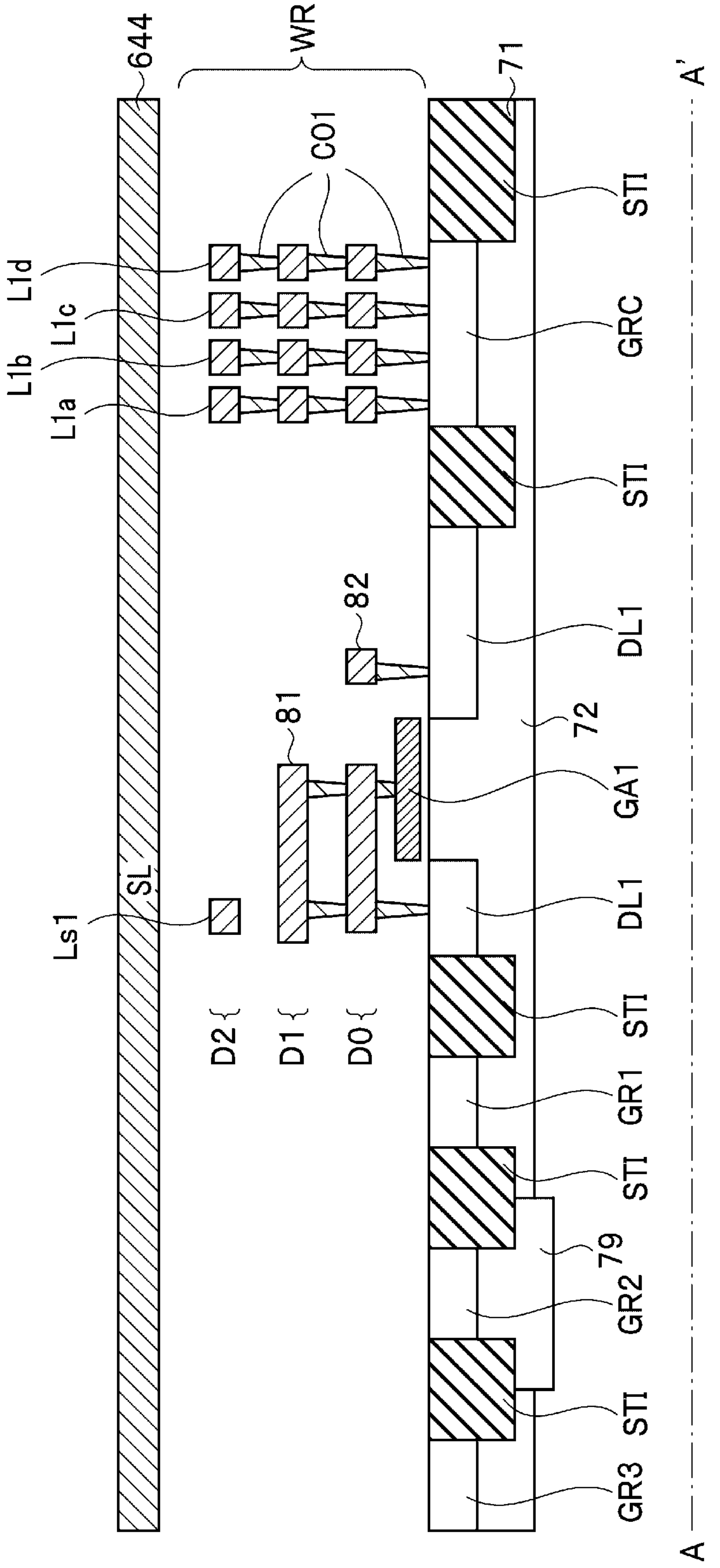
FIG. 15 is a cross-sectional view illustrating a cross-sectional shape cut along the line A-A' of FIG. 13.

FIG. 15 is a cross-sectional view illustrating a cross-sectional shape cut along the line A-A' of FIG. 13. FIG. 15 shows a wiring region WR at a position different from the wiring region WR of the peripheral circuit shown in FIG. 4. A well region 72 is formed in an upper surface portion of the semiconductor substrate 71, and two diffusion layers DL1 functioning as the source and the drain are formed in the well region 72. The gate GA1 is formed on the surface of the semiconductor substrate 71 between the diffusion layers DL1 via a gate insulating film. One GGNMOS is configured with each of the diffusion layers DL1 and the gate GAL.

One diffusion layer DL1 is connected to the wiring 81 formed in the wiring layer D1 via the contact. Guard rings GR1, GR2, and GR3 are formed around the diffusion layer DL1, and an element separation region STI is formed between the diffusion layer DL1 and each of the guard rings GR1 to GR3. An N-type well region 79 that defines the well region 72 is also formed.

The other diffusion layer DL1 is connected to the wiring 82 formed in the wiring layer DO via the contact. The intermediate guard ring GRC is formed around the diffusion layer DL1 via the element separation region STI. The intermediate guard rings GRC are connected to the wirings L1*a*, L1*b*, L1*c*, and L1*d* formed in the wiring layer D2 via the respective contacts CO1. That is, the wirings L1*a*, L1*b*, L1*c*, and L1*d* are individually connected to the intermediate guard ring GRC.

In the embodiment configured in this way, in the resistance adjustment region, the number of wirings L1 forming the wiring connection portions LCB for connecting the wiring L1 to the wiring Ls1 is set. The wiring resistance between the VSS pad Ps and the intermediate guard ring GRC may be appropriately set according to the number of wiring connection portions LCB. The voltage of the semiconductor substrate 71 is more likely to be floating according to the wiring resistance between the VSS pad Ps and the intermediate guard ring GRC, and the latch-up characteristics and the ESD characteristics may be set. As a result, it is possible to perform an optimum setting for obtaining good ESD characteristics while preventing the occurrence of latch-up.

As described above, in the present embodiment, it is possible to optimize the wiring resistance of the wiring for connecting the intermediate guard ring GRC and the VSS pad Ps formed relatively close to the GGNMOS, and to improve the ESD characteristics while preventing the occurrence of latch-up.

Second Embodiment

Figure 16:
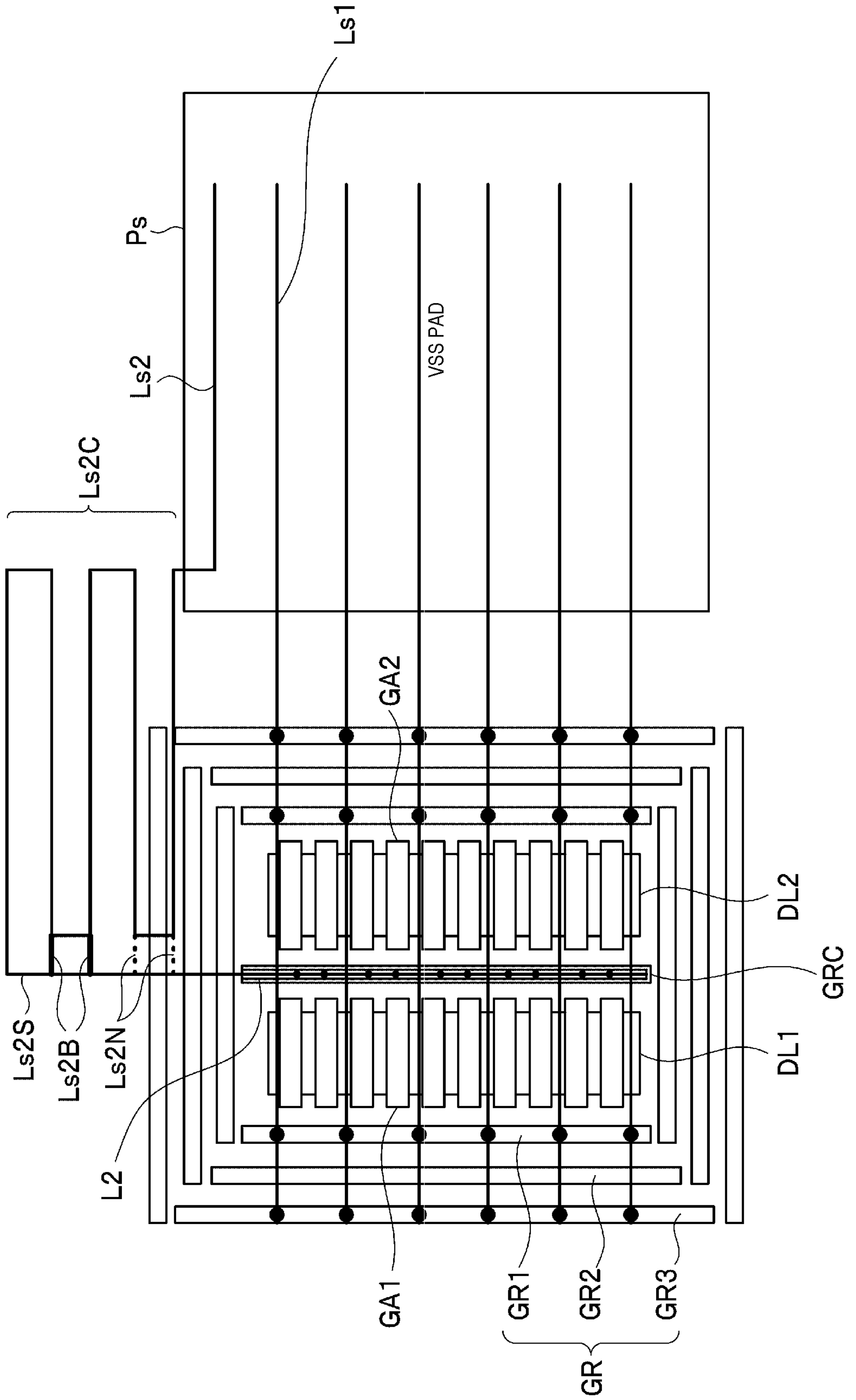
FIG. 16 is an explanatory view illustrating a second embodiment.

FIG. 16 is an explanatory view illustrating a second embodiment. In FIG. 16, the same elements as in FIG. 11 are denoted by the same reference numerals, and descriptions thereof will be omitted. In FIG. 16 as well, the wiring between the VPP pad and the VSS pad and the source and drain of the GGNMOS is not shown.

The first embodiment shows an example in which the wiring resistance of the wiring for connecting the intermediate guard ring GRC and the VSS pad Ps is optimized by determining how many wirings among the plurality of wirings L1 formed on the intermediate guard ring GRC are connected to the wiring Ls1. On the other hand, the present embodiment is an example of optimizing the wiring resistance by appropriately setting a wiring length of the wiring for connecting the intermediate guard ring GRC and the VSS pad Ps.

In the present embodiment, the wiring Ls1 is connected between the VSS pad Ps and the guard rings GR1 and GR3, and is not connected between the VSS pad Ps and the intermediate guard ring GRC. In the present embodiment, the wiring L2 and the wiring Ls2 are employed as the wiring for connecting the VSS pad Ps and the intermediate guard ring GRC.

The wiring L2 is formed on the intermediate guard ring GRC along the intermediate guard ring GRC. One end of the wiring Ls2 is connected to the VSS pad Ps, and the other end side is formed on the wiring L2 along the wiring L2. The wiring Ls2 is electrically connected to the intermediate guard ring GRC via the wiring L2 by the contact indicated by the black circle. For example, the wiring Ls2 is formed in the wiring layer D2, and the wiring L2 is formed in the wiring layer D1.

The wiring Ls2 has a bent portion Ls2C having a bent shape in addition to a linear portion connected to the VSS pad Ps and a linear portion Ls2S connected to the wiring L2. As a result of the bending of the wiring, in the bent portion Ls2C, one or more regions (resistance adjustment regions) close to the linear portion Ls2S connected to the VSS pad Ps are formed. In the example of FIG. 16, two resistance adjustment regions are provided, but the number of resistance adjustment regions may be appropriately set. In the present embodiment, in a predetermined resistance adjustment region among the plurality of resistance adjustment regions, a wiring short-circuit portion Ls2B (thick line portion) for connecting the bent portion Ls2C and the linear portion Ls2S to each other may be formed.

In the example in FIG. 16, one of the two resistance adjustment regions is a wiring non-formed region Ls2N (dashed line portion) in which the wiring is not formed, and the other is a wiring short-circuit portion Ls2B indicated by a thick line. By providing the wiring short-circuit portion Ls2B, it is possible to shorten the substantial wiring length between the VSS pad Ps and the intermediate guard ring GRC. That is, it is possible to optimize the wiring resistance of the wiring for connecting the intermediate guard ring GRC and the VSS pad Ps by adjusting the substantial wiring length by setting any resistance adjustment region as the wiring non-formed region Ls2N and setting any resistance adjustment region as the wiring short-circuit portion Ls2B among the plurality of the resistance adjustment region.

In the present embodiment, a route for short-circuiting to shorten the wiring length with respect to the bent wiring may be provided, and the bent shape of the wiring is not particularly limited.

In this way, the same effects as those of the first embodiment can be obtained in the present embodiment as well.

Third Embodiment

Figure 17:
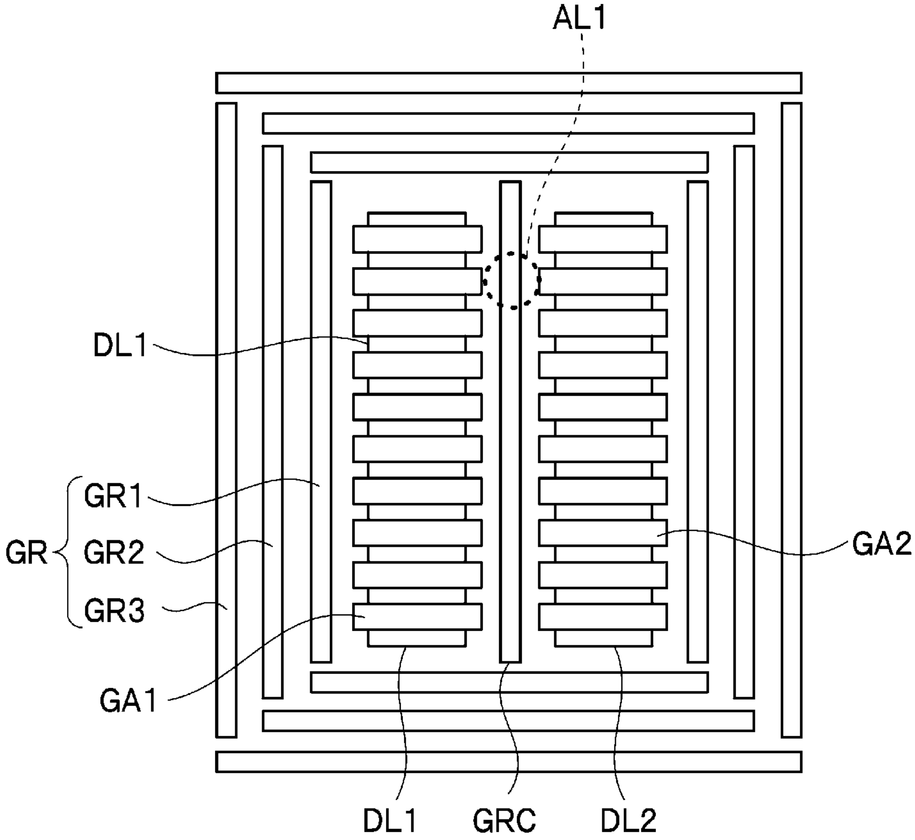
FIG. 17 is a view showing a third embodiment with the wiring for connecting the VPP pad, the VSS pad, and the GGNMOS omitted.
Figure 18:
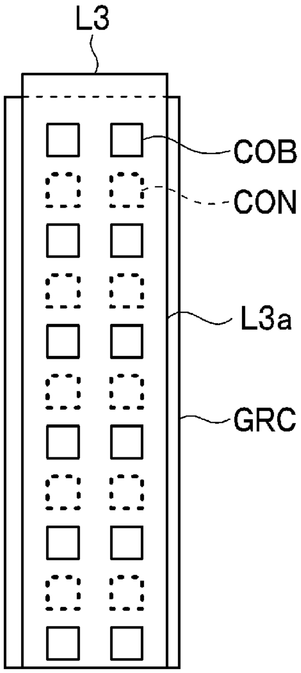
FIG. 18 is a diagram illustrating the third embodiment.

FIGS. 17 and 18 are explanatory views illustrating a third embodiment. In FIG. 17, the same elements as in FIG. 16 are denoted by the same reference numerals, and descriptions thereof will be omitted. FIG. 17 is a view showing the wiring for connecting the VPP pad, the VSS pad, and the GGNMOS omitted. In addition, FIG. 18 is an enlarged plan view showing a region surrounded by a circle in FIG. 17.

The present embodiment shows another method of optimizing the wiring resistance of the wiring for connecting the intermediate guard ring GRC and the VSS pad Ps. FIG. 17 is different from the second example in that the wiring L3 is employed instead of the wiring L2 and the wiring Ls2. The wiring L3 includes a wiring portion L3*a* formed on the intermediate guard ring GRC along the intermediate guard ring GRC. The wiring L3 has one end connected to the VSS pad Ps and the other end side connected to the wiring portion L3*a*.

A plurality of resistance adjustment regions are provided in the wiring portion L3*a* by the contact hole portion. Each of the resistance adjustment regions includes a contact forming portion COB (depicted as a square frame in FIG. 18) in which the contact material is filled in the contact hole portion, and a contact formed region CON (depicted as a dashed line frame in FIG. 18) in which the contact material is not filled in the contact hole portion. The example of FIG. 18 shows an example in which 12 resistance adjustment regions are formed as the contact forming portion COB and 10 resistance adjustment regions are formed as the contact formed region CON. As the number of contact forming portion COB increases, the wiring resistance between the intermediate guard ring GRC and the VSS pad Ps decreases, and as the number of contact formed regions CON increases, the wiring resistance between the intermediate guard ring GRC and the VSS pad Ps increases.

That is, the wiring resistance of the wiring for connecting the intermediate guard ring GRC and the VSS pad Ps may be optimized by adjusting the number of contact forming portions COB (contact formed regions CON) among the plurality of resistance adjustment regions.

In this manner, the present embodiment can also obtain the same effect as the effect of each of the above-described embodiments.

The second and third embodiments may be combined to optimize the wiring resistance of the wiring for connecting the intermediate guard ring GRC and the VSS pad Ps.

The present disclosure is not limited to the above-described embodiment, and may be variously modified without departing from the gist thereof in the implementation stage. In addition, the above embodiment includes disclosures at various stages, and various disclosures can be extracted by appropriate combinations of a plurality of disclosed configuration requirements. For example, even when some of the configuration requirements are deleted from all the configuration requirements shown in the embodiment, when the problem described in the section of problem to be solved by the disclosure can be solved and the effect described in the section of effect of the disclosure can be obtained, a configuration from which the configuration requirement is deleted can be extracted as the disclosure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first pad to which a high voltage is to be input;
a second pad to which a low voltage is to be input;
a third pad to which a ground voltage is to be input; and
a protection circuit provided between the first pad and the third pad,
wherein the protection circuit includes
a first protection element group including a plurality of first transistors arranged in a first direction,
a second protection element group including a plurality of second transistors arranged in the first direction and disposed apart from the first protection element group in a second direction orthogonal to the first direction,
an outer guard ring provided around the first and second protection element groups, and
an intermediate guard ring provided between the first protection element group and the second protection element group and connected to the third pad via a resistance element.

2. The semiconductor device according to claim 1, wherein the resistance element includes:
a first wiring connected to the third pad;
a plurality of second wirings connected to the intermediate guard ring; and
a wiring connection portion that connects a predetermined number of the second wirings to the first wiring.

3. The semiconductor device according to claim 2, wherein
the first wiring is provided in the second direction,
each of the second wirings is provided in the same wiring layer as the first wiring and extends in the first direction along the intermediate guard ring other than at an intersection position with the first wiring, and
the wiring connection portion connects the predetermined number of the second wirings and the first wiring to each other at the intersection position.

4. The semiconductor device according to claim 1, wherein the resistance element includes:
a third wiring that connects the third pad and the intermediate guard ring to each other, wherein
the third wiring includes a first end portion connected to the third pad, a second end portion connected to the intermediate guard ring, and a bent portion provided between the first and second end portions, and
the bent portion includes a short-circuit portion that shortens a wiring length between the first and second end portions.

5. The semiconductor device according to claim 1, wherein the resistance element includes:
a fourth wiring that connects the third pad and the intermediate guard ring to each other, wherein
the fourth wiring has a plurality of contact hole portions that connect the fourth wiring to the intermediate guard ring, and a predetermined number of the contact hole portions are filled with a contact material.

6. The semiconductor device according to claim 1, wherein
each of the transistors of the first and second protection element groups is a GGNMOS transistor.

7. The semiconductor device according to claim 1, wherein the outer guard ring is connected to the third pad.

8. The semiconductor device according to claim 7, further comprising:
a first guard ring provided around the outer guard ring and connected to the second pad; and
a second guard ring provided around the first guard ring and connected to the third pad.

9. The semiconductor device according to claim 8, wherein the first and second transistors are formed on a well region and the outer guard ring, the second guard ring, and the intermediate guard ring are in direct contact with the well region.

10. The semiconductor device according to claim 9, wherein the well region is of a first conductivity type and the first guard ring is in direct contact with a well region of a second conductivity type which is formed on the well region of the first conductivity type.

11. A semiconductor memory device comprising:
a memory cell array;
a first pad through which a first power supply voltage for operating the memory cell array is to be supplied;
a second pad through which a second power supply voltage for operating the memory cell array is to be supplied;
a third pad through which a ground voltage is to be supplied;
a protection circuit between the first and third pads, wherein the protection circuit includes
a plurality of first transistors arranged in a first direction and formed on a well region of a first conductivity type, a plurality of second transistors arranged in the first direction, formed on the well region of the first conductivity type, and disposed apart from the first transistors in a second direction orthogonal to the first direction, an outer guard ring in direct contact with the well region of the first conductivity type and provided around the plurality of first transistors and the plurality of second transistors, and an intermediate guard ring in direct contact with the well region of the first conductivity type, provided between the plurality of first transistors and the plurality of second transistors, and connected to the third pad via a resistance element.

12. The semiconductor memory device according to claim 11, wherein the resistance element includes:

a first wiring connected to the third pad;

a plurality of second wirings connected to the intermediate guard ring; and a wiring connection portion that connects a predetermined number of the second wirings to the first wiring.

13. The semiconductor memory device according to claim 12, wherein the first wiring is provided in the second direction, each of the second wirings is provided in the same wiring layer as the first wiring and extends in the first direction along the intermediate guard ring other than at an intersection position with the first wiring, and the wiring connection portion connects the predetermined number of the second wirings and the first wiring to each other at the intersection position.

14. The semiconductor memory device according to claim 11, wherein the resistance element includes:

a third wiring that connects the third pad and the intermediate guard ring to each other, wherein the third wiring includes a first end portion connected to the third pad, a second end portion connected to the intermediate guard ring, and a bent portion provided between the first and second end portions, and the bent portion includes a short-circuit portion that shortens a wiring length between the first and second end portions.

15. The semiconductor memory device according to claim 11, wherein the resistance element includes:

a fourth wiring that connects the third pad and the intermediate guard ring to each other, wherein the fourth wiring has a plurality of contact hole portions that connect the fourth wiring to the intermediate guard ring, and a predetermined number of the contact hole portions are filled with a contact material.

16. The semiconductor memory device according to claim 11, wherein each of the first and second transistors is a GGNMOS transistor.

17. The semiconductor memory device according to claim 11, wherein the outer guard ring is connected to the third pad.

18. The semiconductor memory device according to claim 17, further comprising:

a first guard ring provided around the outer guard ring and connected to the second pad; and a second guard ring in direct contact with the well region, provided around the first guard ring, and connected to the third pad.

19. The semiconductor memory device according to claim 18, wherein the first guard ring is in direct contact with a well region of a second conductivity type which is formed on the well region of the first conductivity type.

20. The semiconductor memory device according to claim 18, wherein the first power supply voltage is higher than the second power supply voltage.

* * * * *